United States Patent
Kandori et al.

(10) Patent No.: US 11,503,741 B2
(45) Date of Patent: Nov. 15, 2022

(54) HOUSING TO DISSIPATE HEAT FROM A HEAT GENERATING BODY

(71) Applicant: CANON KABUSHIKI KAISHA, Tokyo (JP)

(72) Inventors: Atsushi Kandori, Kanagawa (JP); Takeru Ohya, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 17/149,162

(22) Filed: Jan. 14, 2021

(65) Prior Publication Data
US 2021/0227722 A1  Jul. 22, 2021

(30) Foreign Application Priority Data
Jan. 22, 2020 (JP) .............................. JP2020-008770

(51) Int. Cl.
*H05K 7/20* (2006.01)
*H05K 5/04* (2006.01)

(52) U.S. Cl.
CPC ..... *H05K 7/20409* (2013.01); *H05K 7/20445* (2013.01); *H05K 5/04* (2013.01)

(58) Field of Classification Search
CPC ........... H05K 7/20409; H05K 7/20445; H05K 7/2039; H05K 5/04
See application file for complete search history.

(56) References Cited

U.S. PATENT DOCUMENTS

| | | | | |
|---|---|---|---|---|
| 4,656,559 A | * | 4/1987 | Fathi | H05K 7/1461 361/721 |
| 5,381,176 A | * | 1/1995 | Tanabe | H05K 7/142 348/E5.025 |
| 5,742,478 A | * | 4/1998 | Wu | H05K 7/20445 361/728 |
| 6,046,908 A | * | 4/2000 | Feng | H05K 7/20154 361/730 |
| 6,411,514 B1 | * | 6/2002 | Hussaini | H05K 7/209 361/689 |
| 8,009,431 B2 | * | 8/2011 | Sun | H05K 7/1429 361/725 |
| 2016/0095253 A1 | * | 3/2016 | Tufty | H05K 5/06 361/699 |
| 2020/0336712 A1 | * | 10/2020 | Shi | H04N 9/315 |

FOREIGN PATENT DOCUMENTS

JP   2010226227 A   10/2010
KR   20110008802 U * 9/2011

* cited by examiner

*Primary Examiner* — Zachary Pape
(74) *Attorney, Agent, or Firm* — Canon U.S.A., Inc. I.P. Division (57) ABSTRACT

A housing includes a tubular housing and a first lid section. The first lid section is fitted to one end portion of the tubular housing. The tubular housing includes a first protruding section protruding toward a first lid section from a joint surface in contact with the first lid section. The first protruding section has a configuration allowing the tubular housing and a heat conductive member, to conduct heat from a heat generating body disposed inside the tubular housing, to be fixed together.

19 Claims, 11 Drawing Sheets

HOUSING TO DISSIPATE HEAT FROM A HEAT GENERATING BODY

BACKGROUND

Field

The present disclosure relates to a housing that dissipates heat from a heat generating body.

Description of the Related Art

Conventionally, in order to prevent the inside of a housing from becoming hot due to a heat generating body, a structure has been proposed in which the heat from the heat generating body is dissipated to the outside of the housing.

In Japanese Patent Application Laid-Open No. 2010-226227, an imaging unit 21 (signal processing unit) which is a heat generating body, a mounting bracket 22 in contact with the imaging unit 21, and a heat dissipation bracket 25 in contact with the mounting bracket 22 and an external terminal 13 are provided. In addition, Japanese Patent Application Laid-Open No. 2010-226227 indicates that the heat dissipation bracket 25 may be in contact not only with the external terminal 13 but also a rear housing 12 in order to improve heat dissipation.

SUMMARY

According to an aspect of the present disclosure, a housing includes a tubular housing, and a first lid section configured to be fitted to one end portion of the tubular housing, wherein the tubular housing includes a first protruding section protruding toward a first lid section from a joint surface in contact with the first lid section, and wherein the first protruding section has a configuration allowing the tubular housing and a heat conductive member, configured to conduct heat from a heat generating body disposed inside the tubular housing, to be fixed together.

Further features of the present disclosure will become apparent from the following description of exemplary embodiments with reference to the attached drawings.

DESCRIPTION OF THE EMBODIMENTS

In the housing discussed in Japanese Patent Application Laid-Open No. 2010-226227, the surface in contact with a heat dissipation bracket 25 and a rear housing 12 is a part of the surface constituting the rear housing 12, and thus the heat dissipation effect by the rear housing 12 is not fully utilized. That is, the housing described in Japanese Patent Application Laid-Open No. 2010-226227 cannot propose a housing that makes best use of the heat dissipation effect by the surface constituting the housing.

Hereinafter, a first exemplary embodiment will be described with reference to FIGS. 1 to 8. The following embodiments all illustrate an example of the present disclosure. In the drawings described below, the components having the same function are given the same reference numerals, and the description thereof may be omitted or simplified. In the specification, the terms indicating the directionality of up, down, right, and left are used for convenience and are not related to the up-down direction when the housing is installed.

Details will be described below. The feature of the present exemplary embodiment is that a tubular housing 100 includes a protruding section protruding in a predetermined direction on a lid side from a joint surface between the tubular housing 100 and a lid section 201 (202), and thus the heat from a heat generating body is more efficiently dissipated to the tubular housing 100. The notation "201 (202)" includes both the case of referring to a member 201 or a member 202 and the case of referring to the member 201 and the member 202.

Figure 1:
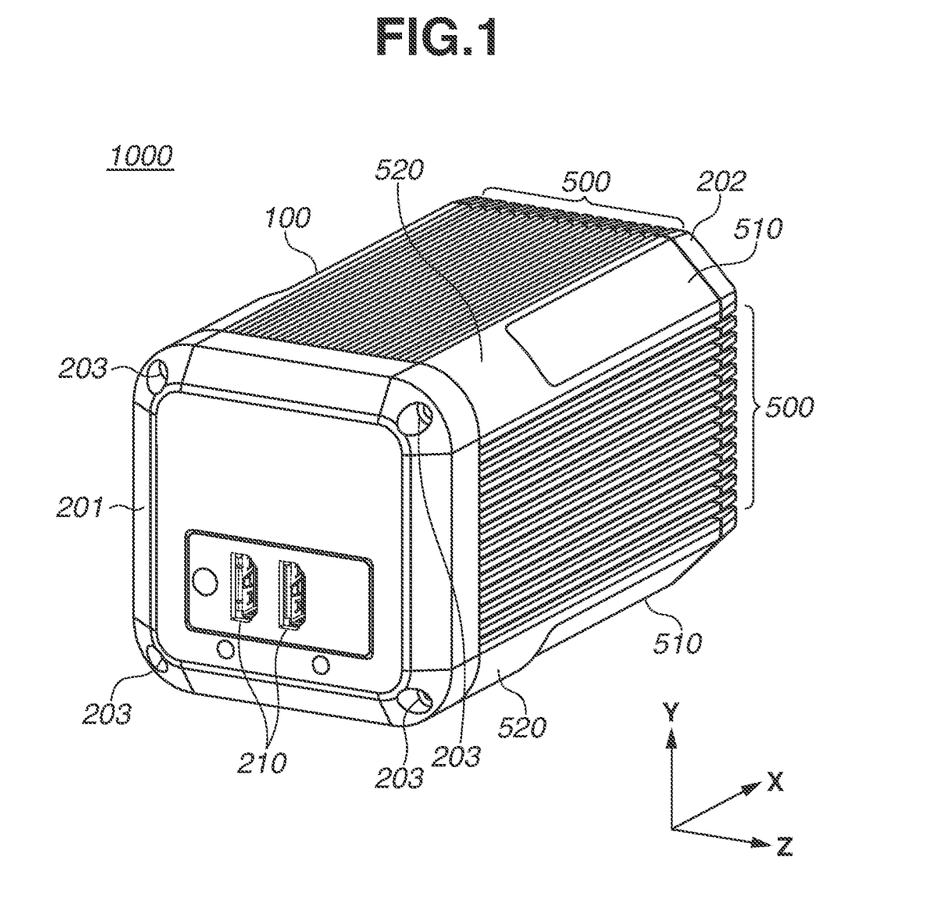
FIG. 1 is a perspective view of a housing.

FIG. 1 is a perspective view of a housing 1000. The housing 1000 includes a lid section 201 (first lid section) combined with the front end (one end) of the tubular housing 100 and a lid section 202 (second lid section) combined with the rear end (the other end), and the outer shape of the housing 1000 is thereby configured. Here, the front lid section 201 is referred to as the first lid section and the rear lid section 202 is referred to as the second lid section for the purpose of description. However, the front lid section 201 may be referred to as the second lid section and the rear lid section 202 may be referred to as the first lid section. That is, the front lid section 201 may be the lid section provided at the other end, and the rear lid section 202 may be the lid section provided at one end.

The tubular housing 100 is configured to have a substantially rectangular parallelepiped shape. Here, an X direction (first direction), a Y direction (second direction) orthogonal to the X direction, and a Z direction (third direction) orthogonal to the X direction and the Y direction are defined. The length of the housing 100 in the X direction is longer than the length in the Y and Z directions. For this reason, the X direction of the housing 100 is called a long axis direction, and the Y direction or Z direction of the housing 100 is sometimes called a short axis direction.

The housing 1000 in which the lid section 201 and the lid section 202 are combined is also configured to have a substantially rectangular parallelepiped shape. That is, the length of the housing 1000 in the X direction is longer than the length in the Y and Z directions.

The lid section 201 and the tubular housing 100 are fixed by a fixing section. Specifically, screws 203 are screwed into the screw holes provided in the tubular housing 100 through the opening portions provided at the four corners of the lid section 201, and thus the lid section 201 and the tubular housing 100 are fixed. In addition, although not illustrated, opening portions are provided at the four corners of the lid section 202, and the lid section 202 and the tubular housing 100 are fixed by screws via the opening portions.

The lid section 201 includes two connectors 210. The connector 210 is configured in such a manner that signals from an imaging apparatus (not illustrated) can be input, and the signals are processed by a signal processing unit provided in the housing 1000.

For example, in order to determine the presence or absence of a defect in a product (workpiece) produced in a factory, there is a system that recognizes a defect from an image data signal acquired by an imaging apparatus, instead of visually determining the defect by a human. In addition, for example, there is even a monitoring system that recognizes a suspicious person from an image data signal acquired by an imaging apparatus. Furthermore, for example, there is even an imaging system in a store, which counts the inventories of the products displayed in a store.

In such a system, the image data signal output from the imaging apparatus (not illustrated) is input to the signal processing unit provided inside the housing 1000 via the connector 210, and various processing is performed in the signal processing unit. For example, in the above example, the determination of the presence or absence of a defect in a workpiece, the determination of whether there is a suspicious person, and the counting of the number of products in stock in the store, and the like are performed. In such image recognition processing, a graphics processing unit (GPU) that processes image data signals in parallel is often used as the signal processing unit. When the amount of calculation by the signal processing unit becomes enormous, heat generation in the signal processing unit can become an issue.

The tubular housing 100, the lid section 201, and the lid section 202 all made of metal. The use of metal allows the dissipation of the heat generated from the signal processing unit. For example, the metal is selected from aluminum, iron, copper, or the like. These metals may be alloys. In addition, it is preferable to select aluminum from the viewpoint of light weight, cost, strength, workability, and heat dissipation.

(Groove Region)

A groove region 500 including a plurality of groove shapes is provided on the right side surface, the left side surface (not illustrated), and the upper surface of the tubular housing 100. Each groove extends in the X direction. Since a heat transfer area can be increased by providing the groove region 500, the heat dissipation from the signal processing unit provided in the housing 1000 can be improved. In the present exemplary embodiment, the groove region 500 is not essential. If the housing 1000 is made of metal, some heat dissipation can be expected. In addition, a groove region may be provided on the lower surface of the tubular housing 100 in order to improve heat dissipation. Furthermore, as illustrated in FIG. 1, the heat dissipation is further improved by providing the groove region 500 on the right side surface, the left side surface (not illustrated), and the upper surface of the lid section 202.

(Flat Surface)

A flat surface 510 is provided on a first corner section formed by the right side surface and the upper surface and a second corner section formed by the right side surface and the lower surface. In addition, although not illustrated, a flat surface is also provided at a third corner section formed by the upper surface and the left side surface and the fourth corner section formed by the left side surface and the lower surface. To improve heat dissipation, it is preferable to expand the groove region in the Y and Z directions up to each corner.

However, when considering the housing 1000 having a signal processing unit as a product, it is necessary to attach a mark such as a trademark, a product number, or a certification mark such as ISO, to the housing 1000. To this end, in FIG. 1, the flat surface 510 is provided at the first corner section formed by the right side surface and the upper surface and the third corner section formed by the upper surface and the left side surface. By attaching a trademark or the like to the flat surface 510, it is possible to improve the visibility of the mark while ensuring heat dissipation. If a flat surface is formed on the upper surface and a mark is attached, the mark can be visually recognized only from the upper surface. In addition, if a flat surface is formed on each side surface and a mark is attached, the mark can be visually recognized only from each side surface. On the other hand, in the present exemplary embodiment, since the mark is attached by forming a flat surface (cut-off portion) at the corner section, the mark can be visually recognized from at least two directions with respect to one flat surface.

In addition, the flat surfaces provided at the second corner section formed by the right side surface and the lower surface and the fourth corner section formed by the left side surface and the lower surface are each a place where the visibility is not higher than the visibility of the flat surfaces provided at the first corner section and the third corner section. Therefore, the product number and certification mark can be attached on the flat surfaces of the second corner section and the fourth corner section. In addition, when a house mark trademark is attached to the flat surfaces of the first corner section and the third corner section, a product trademark may be attached to the flat surfaces of the second section and fourth corner section.

Furthermore, even when the mark is not provided on the flat surfaces, the flat surfaces can be provided at the corners, and thus there are benefits such as that the flat surfaces can be used as a handle when a person carries the housing, or the flat surfaces become a fixing point when fixing the housing in a predetermined place.

(Curved Portion)

As illustrated in FIG. 1, the flat surface 510 is not provided over the entire region of each corner of the tubular housing 100 in the X direction. If the flat surface 510 is provided over the entire region in the X direction, the visibility of the mark will be high, but the proportion of the flat surface will increase. For this reason, at manufacturing sites such as clean rooms, dust and the like may accumulate on the flat surface and affect the quality of a product. Therefore, by providing a curved portion 520 at each corner instead of forming the entire region by a flat surface, it is possible to suppress the accumulation of dust and the like on the flat surface. The curved portion 520 is curved so as to have a protruding shape with respect to the outside of the tubular housing 100. In addition, by providing the curved portion, there is a benefit that the impact when the housing 1000 is dropped on a floor can be mitigated.

Figure 2:
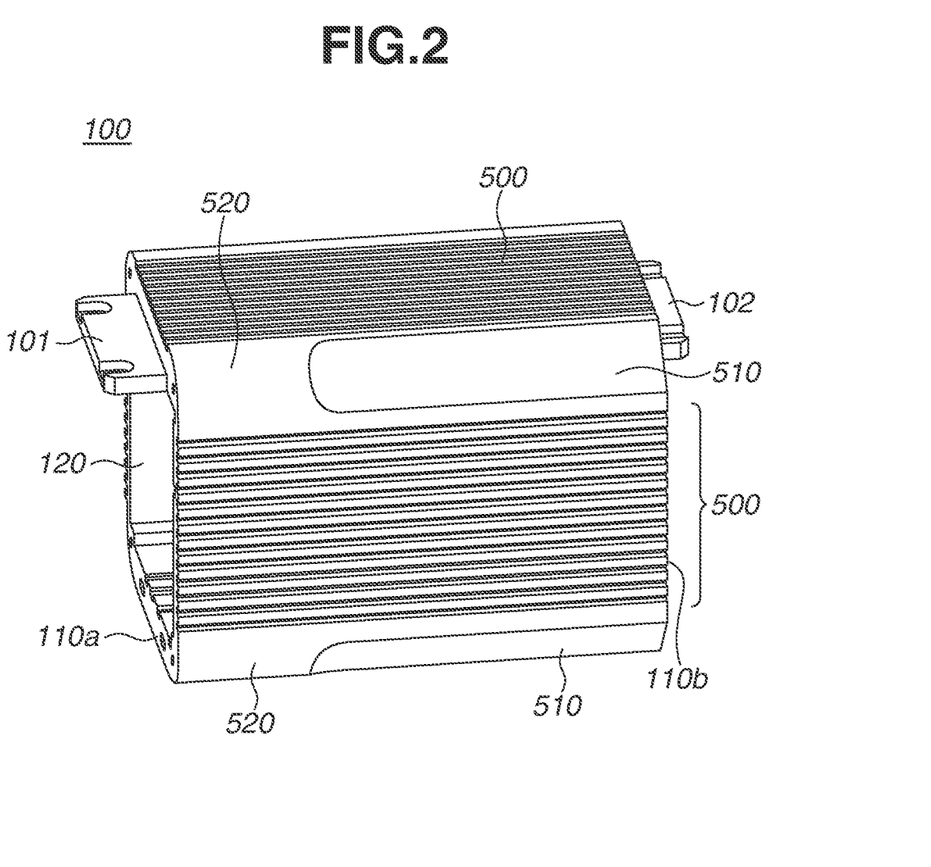
FIG. 2 is a perspective view of the housing.

FIG. 2 is a perspective view of the tubular housing 100. The tubular housing 100 includes a joint surface 110a where the lid section 201 and the tubular housing 100 are in contact with each other and a joint surface 110b where the lid section 202 and the tubular housing 100 are in contact with each other. FIG. 2 illustrates the form before the signal processing unit which is a heat generating body is provided, and thus the inside of the tubular housing 100 is a cavity 120.

In FIG. 2, a protruding section 101 (first protruding section) is provided on the front side of the tubular housing 100, and a protruding section 102 (second protruding section) is provided on the rear side. Here, the front protruding section 101 is referred to as the first protruding section and the rear protruding section 102 is referred to as the second protruding section, but the front protruding section 101 may be referred to as the second protruding section and the rear protruding section 102 may be referred to as the first protruding section.

The protruding section 101 is provided so as to protrude from a joint surface 110a in the front X direction (first direction), and the protruding section 102 is provided so as to protrude from a joint surface 110b in the rear X direction (first direction). As will be described below, a metal plate in contact with the main surface of the heat generating body is fixed to the protruding section 101 and the protruding section 102 via a screw. The metal plate has the function of conducting the heat of the heat generating body, and thus is sometimes called a heat conductive member.

The protruding sections 101 and 102 are made of metal. The metal is selected from aluminum, iron, copper, or alloys of these. It is preferable to select aluminum from the viewpoint of light weight, cost, strength, workability, and heat dissipation. In addition, it is preferable that the protruding section 101 and the protruding section 102 are made of the same metal material as the metal material of the tubular housing 100. This is because when forming the shape of the tubular housing 100, the protruding section 101 and the protruding section 102 can be integrally formed, which is beneficial in terms of process person-hours and material cost.

Figure 4A:
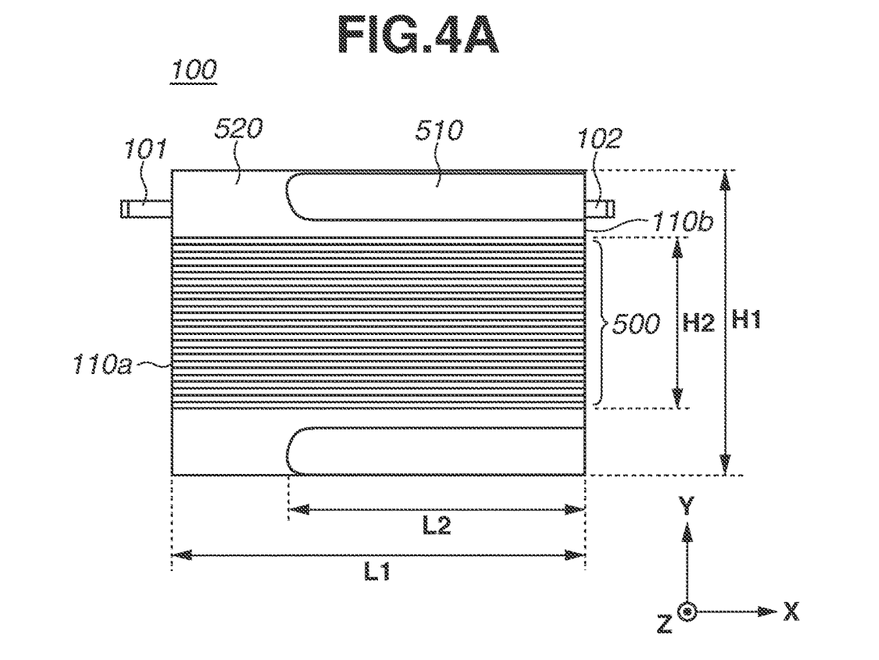
FIGS. 4A and 4B are a side view and a top view of the housing.
Figure 4B:
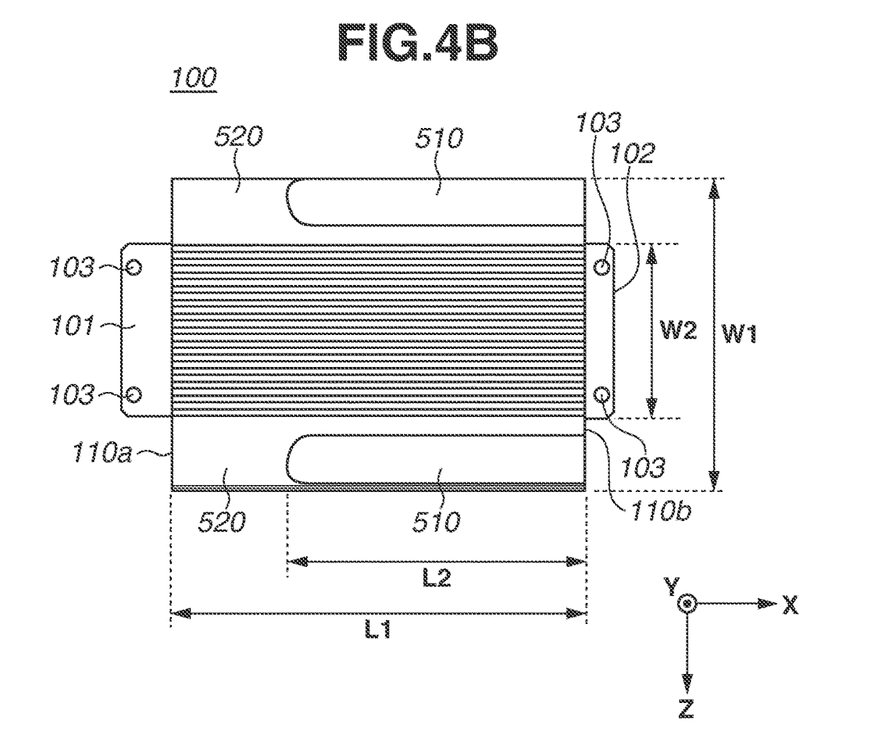

FIG. 4A is a right side view of the tubular housing 100, and FIG. 4B is a top view of the tubular housing 100.

FIG. 4A illustrates a protruding section 101 protruding from the joint surface 110a in the X direction (negative direction) and a protruding section 102 protruding from the joint surface 110b in the X direction (positive direction).

FIG. 4A illustrates a flat surface 510 formed by the right side surface and the upper surface of the tubular housing 100 and a flat surface 510 formed by the right side surface and the lower surface of the tubular housing 100. L1 is a length of the tubular housing 100 in the X direction, and L2 is a length of the flat surface 510 in the X direction. As described above, the curved portion 520 is provided, and thus L2/L1 is smaller than 1. For example, L2/L1 is 0.7 or more and 0.9 or less.

In addition, FIG. 4A illustrates a groove region 500 provided on the right side surface of the tubular housing 100. H1 is a height of the tubular housing 100 in the Y direction, and H2 is a height (length) at which the groove region 500 is provided in the Y direction. As described above, the flat surface 510 and the curved portion 520 are provided, and thus H2/H1 is smaller than 1. On the other hand, in order to improve heat dissipation, it is preferable that H2/H1 is of a certain magnitude. For example, H2/H1 is 0.5 or more and 0.7 or less.

As illustrated in FIG. 4B, the protruding section 101 is provided with two opening portions 103 (first and second opening portions). In addition, the protruding section 102 is also provided with two opening portions 103 (third and fourth opening portions). These opening portions are used to allow the metal plate in contact with the main surface of the heat generating body and the protruding sections 101 and 102 to be fixed, as will be described below.

FIG. 4B illustrates the groove region 500 provided on the upper surface of the tubular housing 100. W1 is a width of the tubular housing 100 in the Z direction, and W2 is a width of the groove region 500 in the Z direction. As described above, the flat surface 510 and the curved portion 520 are provided, and thus W2/W1 is smaller than 1. On the other hand, in order to improve heat dissipation, it is preferable that W2/W1 is of a certain magnitude. For example, W2/W1 is 0.5 or more and 0.7 or less.

Figure 5A:
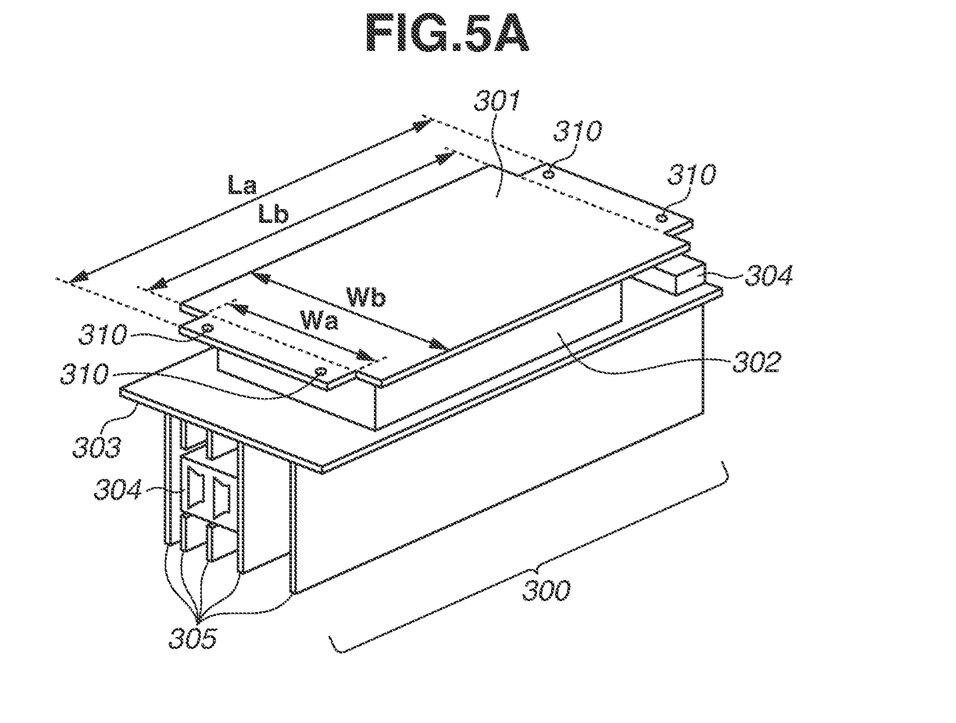
FIGS. 5A and 5B are a perspective view and a front view of a unit stored in the housing.
Figure 5B:
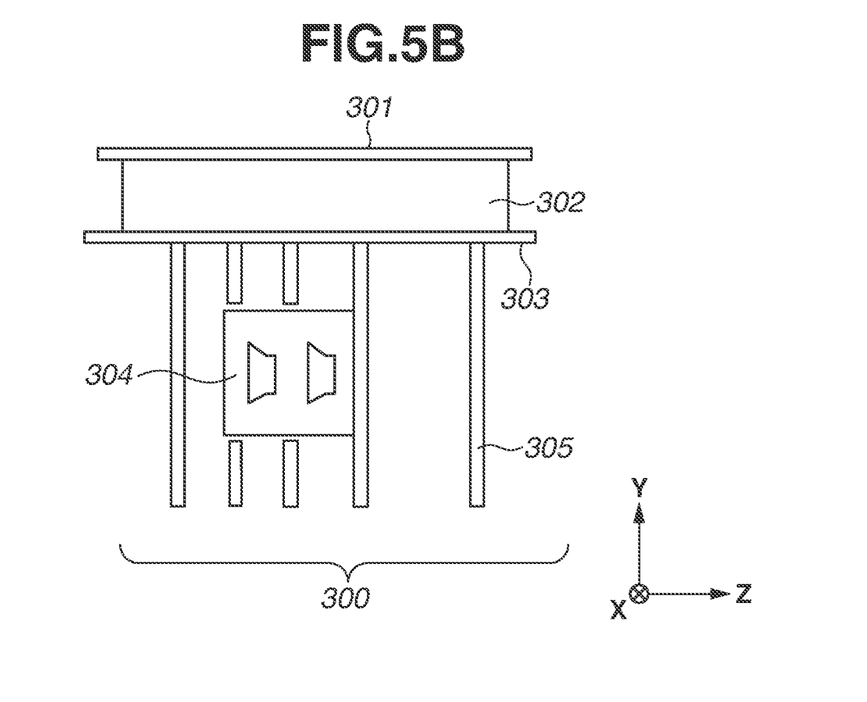

FIG. 5A is a perspective view of a unit 300 stored in the housing 1000, and FIG. 5B is a YZ plan view of the unit 300.

In a case where the unit 300 is a unit that processes an image data signal input via a connector 304 provided on the front surface section, the signal processing unit 302 can be a heat generating body (hereinafter, the "signal processing unit 302" may be sometimes referred to as a "heat generating body 302"). For example, in image recognition processing, the amount of calculation by the GPU which is the signal processing unit becomes enormous, and heat generation in the signal processing unit becomes an issue.

A circuit board 303 extends in the Z direction (horizontal direction), and a circuit board 305 extends in the Y direction (vertical direction). The circuit boards 303 and 305 are used as an electrical path for inputting the signal input from the connector 304 on the front surface section to the signal processing unit 302. In addition, the circuit boards 303 and 305 are used as an electrical path for outputting the signal processed by the signal processing unit 302 from the connector 304 on the rear surface section.

Interfaces in accordance with various standards and original interfaces can be used for the connector 304 on the input side. Exemplary interfaces in accordance with various standards include a universal serial bus (USB), high-definition multimedia interface (HDMI) (registered trademark), and Gigabit Ethernet (registered trademark) (GbE). In addition, it is not always necessary to input the signal via a wire, and the signal may be input wirelessly. In this case, the connector 304 is unnecessary. For example, Wireless Fidelity (Wi-Fi) (registered trademark) or Long Term Evolution (LTE) can be used.

Various interfaces can also be used for the connector 304 on the output side whether wired or wireless.

The signal processing unit 302 processes the image signal from an imaging apparatus. For example, examples of image processing used for machine vision include pattern matching, blob analysis, edge measurement, and spatial filtering.

The signal processing unit 302 may be configured to be accessible from the outside by using a web application or Application Programming Interface (API).

The heat generating body 302 is, for example, a hexahedron, and is provided in such a manner that the main surface of a metal plate 301 is thermally connected onto the main surface of the hexahedron. For example, the thermally connected state refers to a state where the main surface of the heat generating body 302 and the main surface of the metal plate 301 are in physical contact. In addition, a heat transfer sheet may be provided between the main surface of the heat generating body 302 and the main surface of the metal plate 301. That is, thermal connection refers not only to physical contact between both members, but also to a member containing a material having high thermal conductivity being provided between the two members. Here, the main surface is the surface with the largest or the second largest area among the six surfaces of the hexahedron. By providing the main surface of the heat generating body 302 and the main surface of the metal plate 301 so as to face each other, the heat of the heat generating body 302 can be efficiently conducted to the metal plate 301.

The metal plate 301 does not have a uniform width in the Z direction. That is, in FIG. 5A, the end portion of the metal plate 301 toward the front side is a region having a width Wa in the Z direction (a first region having a first width). In addition, the region of the metal plate 301, which belongs to the central part behind the first region, is a region having a width Wb larger than the width Wa (a second region having a second width). Furthermore, the end portion of the metal plate 301 toward the rear side is a region having a width Wa in the Z direction (a third region having a third width). In the X direction, a length La of the region occupied by the first region, the second region, and the third region is longer than a length Lb of the region occupied only by the second region.

Figure 3:
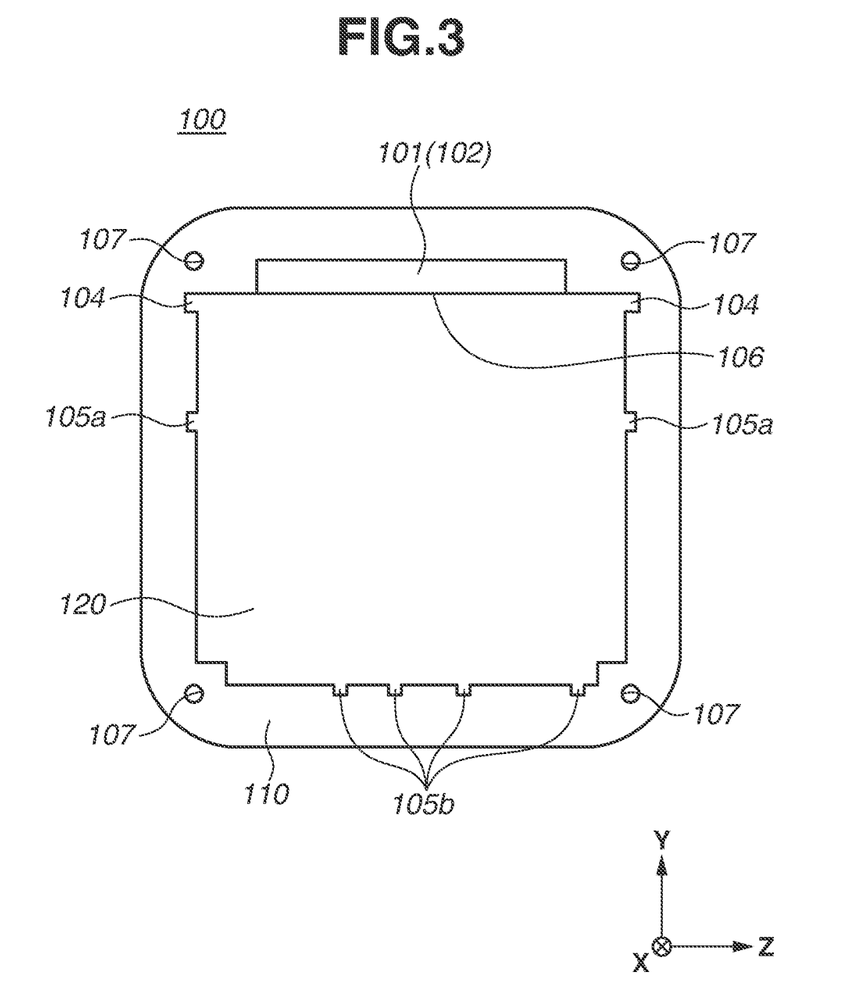
FIG. 3 is a front view of a cross section of the housing.

FIG. 3 illustrates a cross section in a YZ plane passing through the protruding section 101 or the protruding section 102 of the tubular housing 100 in a state where the unit 300 is not mounted on the tubular housing 100. There is no difference in the basic configuration between the front view and the rear view of the tubular housing 100, and thus the two forms are represented by one drawing. In addition, as illustrated in FIG. 1, the tubular housing 100 is provided with the groove region 500, but in such cross-sectional views as exemplified by FIG. 3, the display of the groove region 500 is appropriately omitted.

As illustrated in FIG. 4B, the protruding section 101 (protruding section 102) of FIG. 3 is provided with two opening portions 103. In addition, as illustrated in FIG. 5B, the metal plate 301 is also provided with two opening portions 310 in the front and two in the rear. Using these opening portions 103 and 310, the metal plate 301 and the protruding sections 101 and 102 are fixed by screws.

As illustrated in FIG. 3, screw holes 107 are provided at the four corners of the tubular housing 100, and the lid section 201 and the tubular housing 100 are configured to be fixed by the screws 203 illustrated in FIG. 1.

The tubular housing 100 includes a heat transfer surface 106 inside the housing and guide grooves 104, 105a, and 105b.

The guide groove 104 is a guide groove for the metal plate 301. That is, the unit 300 is stored inside the tubular housing 100 while inserting the metal plate 301. Similarly, the guide groove 105a is a guide groove for the circuit board 303, and the guide groove 105b is a guide groove for the circuit board 305. These guide grooves 104 have a function of smoothly storing the unit 300 and preventing the position of the unit 300 from being easily displaced after the unit 300 is stored.

Figure 6A:
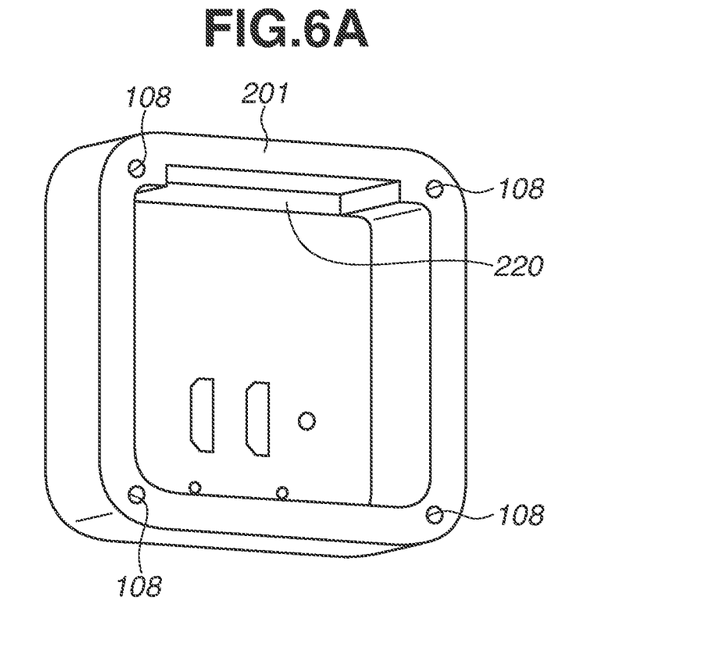
FIGS. 6A and 6B are perspective views of a front lid and a rear lid.

FIG. 6A is a perspective view of the lid section 201. A recessed portion 220 is recessed in the depth direction from the plane of FIG. 6A. The recessed portion 220 is configured to fit the protruding section 101 illustrated in FIG. 3. As a result, the protruding section 101 is configured so as not to be exposed to the outside of the housing 1000.

The tubular housing 100 and the lid section 201 are fixed by a fixing section. Specifically, screw holes 108 are provided at the four corners of the lid section 201. Screws are provided through the screw holes 108 and the screw holes 107 illustrated in FIG. 3, and the tubular housing 100 and the lid section 201 are fixed.

Figure 6B:
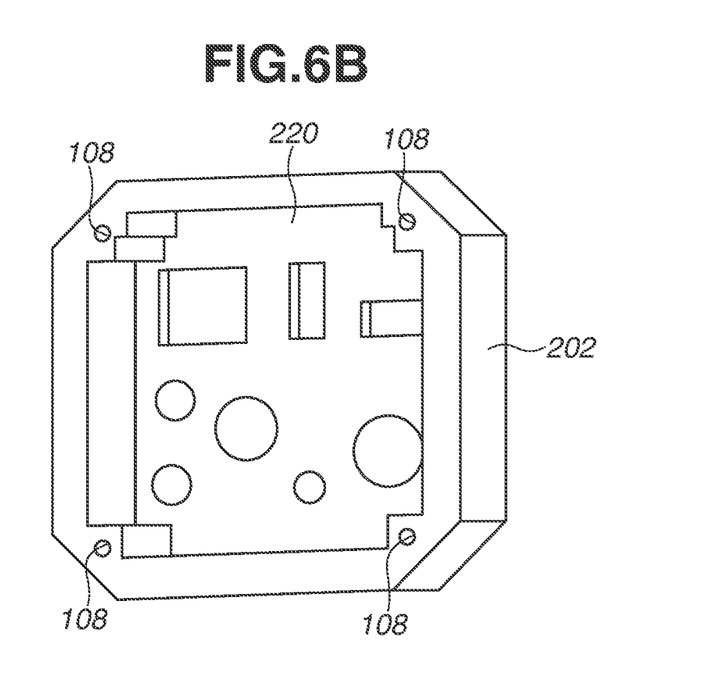

FIG. 6B is a perspective view of the lid section 202. A recessed portion 220 is recessed in the depth direction from the plane of FIG. 6B. The recessed portion 220 is configured to fit the protruding section 102 illustrated in FIG. 3. As a result, the protruding section 102 is not exposed to the outside of the housing 1000.

The tubular housing 100 and the lid section 202 are fixed by a fixing section. Specifically, screw holes 108 are provided at the four corners of the lid section 202. Screws are provided through the screw holes 108 and the screw holes 107 illustrated in FIG. 3, and the tubular housing 100 and the lid section 202 are fixed.

The screw hole 108 does not have to be provided with a screw groove corresponding to the shape of the screw thread of the screw. This is because, if a screw groove is formed in the screw hole 107 of the tubular housing 100, at least, the lid section 201 or the lid section 202 and the tubular housing 100 can be fixed.

In addition, since the protruding sections 101 and 102 are configured so as not to be exposed to the outside of the housing 1000, the fixing section that fixes the protruding sections 101 and 102 and the metal plate 301 is also not exposed to the outside. Thus, there is also a design effect that does not spoil the appearance. Moreover, since the fixing section that fixes the protruding sections 101 and 102 and the metal plate 301 is not exposed to the outside, it is easy to improve the noise characteristics and sealability.

Figure 7:
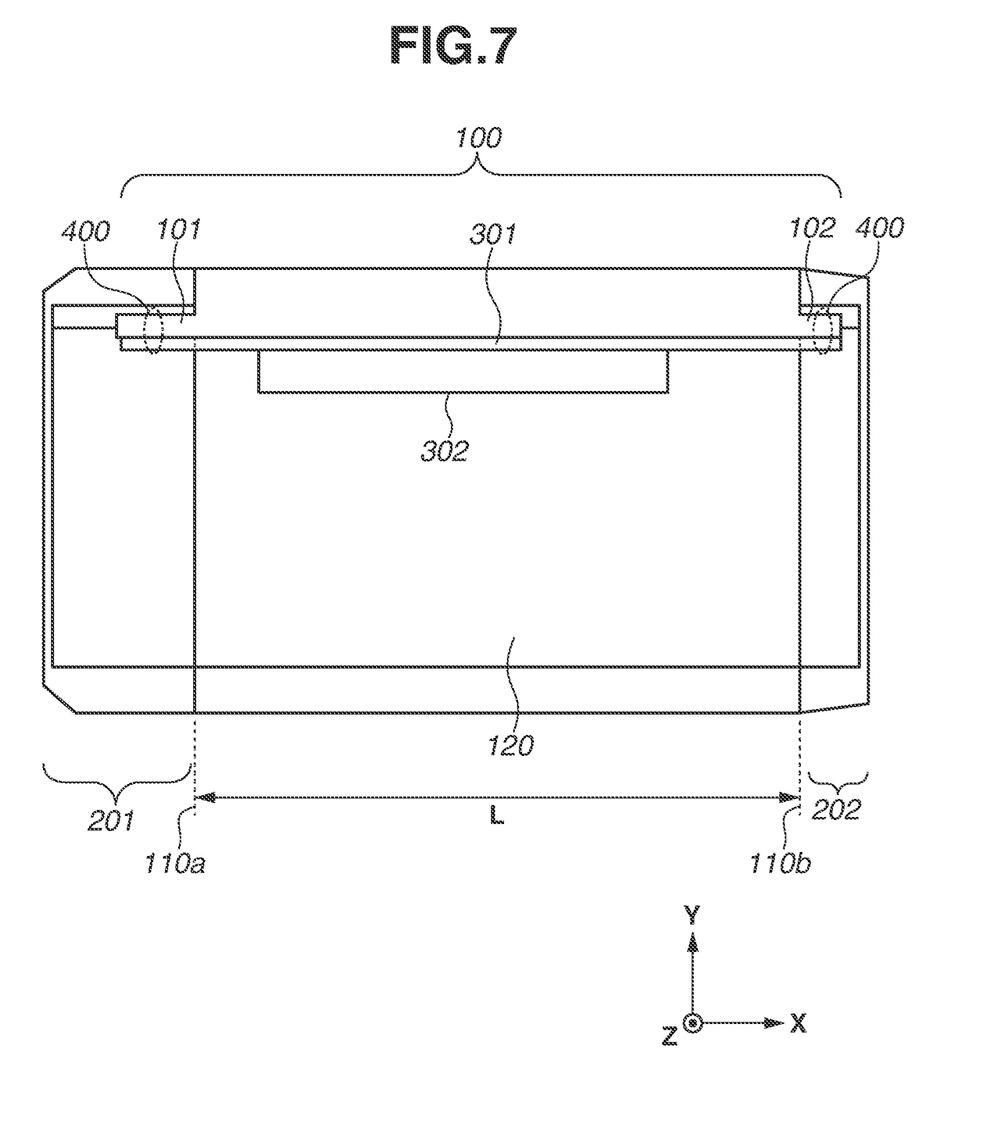
FIG. 7 is a perspective view of the housing including a front lid, a rear lid, and a unit, as seen from a side.

FIG. 7 is a perspective view of the housing 1000 including the lid section 201, the tubular housing 100, and the lid section 202 as viewed from the right side. The protruding section 101 protrudes in the X direction (negative direction) from the joint surface 110a, and the metal plate 301 and the protruding section 101 are fixed by a fixing section 400. The fixing section 400 is, for example, a bolt and a nut, and the protruding section 101 and the metal plate 301 may be fixed via the opening portion 103 and the opening portion 310. In addition, the fixing section 400 is a screw. That is, a thread groove may be provided in the opening portion 103 and the opening portion 310, and the protruding section 101 and the metal plate 301 may be fixed by a screw having a screw thread.

As illustrated in FIG. 7, in the present exemplary embodiment, the protruding section 101 protruding in the X direction (negative direction) from the joint surface 110a between the tubular housing 100 and the lid section 201 is provided. The protruding section 101 is configured in such a manner that the tubular housing 100 and the metal plate 301 are fixed at the protruding section 101. By providing the protruding section 101, the area of the metal plate 301 facing the upper surface of the tubular housing 100 can be expanded, and the heat from the heat generating body 302 can be efficiently dissipated. In Japanese Patent Application Laid-Open No. 2010-226227, a metal plate (heat dissipation bracket) is in contact with only a part of the surface constituting the housing. In addition, in Japanese Patent Application Laid-Open No. 2010-226227, the housing is not provided with a protruding section as in the present exemplary embodiment, and thus the area where the metal plate and the surface constituting the housing face each other cannot be increased. On the other hand, in the present exemplary embodiment, since the protruding section is provided, the area where the metal plate and the surface constituting the housing face each other can be made larger without being limited to the joint surface between the lid section and the tubular housing, and it is possible to increase the heat dissipation effect by the surface constituting the housing.

In addition, similarly, in the present exemplary embodiment, the protruding section 102 protruding in the X direction (positive direction) from the joint surface 110b between the tubular housing 100 and the lid section 202 is provided. The protruding section 102 is configured in such a manner that the tubular housing 100 and the metal plate 301 are fixed at the protruding section 102. By providing the protruding section 102, the area of the metal plate 301 facing the upper surface of the tubular housing 100 can be expanded, and the heat from the heat generating body 302 can be efficiently dissipated.

In order to release heat from the heat generating body 302 more efficiently, it is preferable that the area of the main surface of the metal plate 301 should be larger than the area of the main surface of the heat generating body 302, as illustrated in FIGS. 5A and 5B. In order to release heat from the heat generating body 302 more efficiently, as in FIGS. 5A and 5B, in a plan view (orthographic projection onto the XZ plane), the heat generating body 302 and the metal plate 301 are configured to overlap so as to cover the entire outer extension of the main surface of the heat generating body 302.

Figure 8:
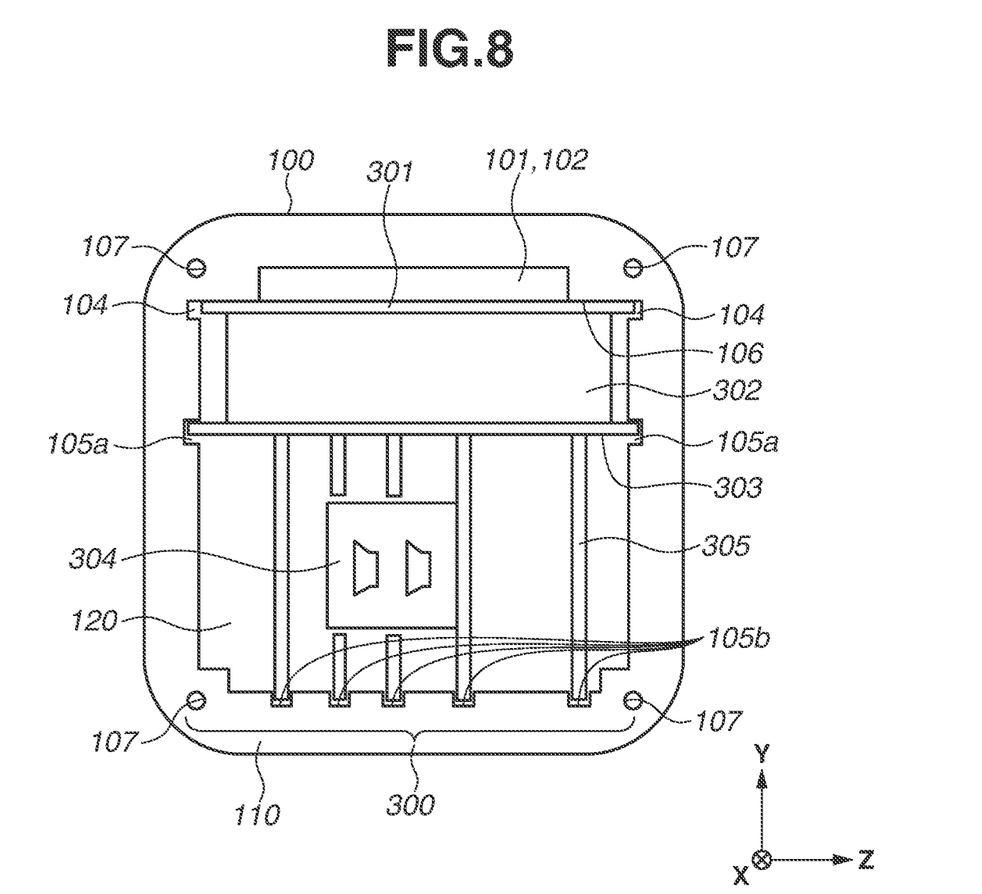
FIG. 8 is a front view of a cross section of the housing including the unit.

FIG. 8 illustrates a cross section in the YZ plane in a case where the unit 300 is mounted on the tubular housing 100. The metal plate 301 is provided in the guide groove 104. As a result, the unit 300 is stored in the tubular housing 100 in such a manner that almost the entire surface of the heat transfer surface 106 inside the housing and the entire main surface of the metal plate 301 face each other. In addition, the guide grooves 105a and 105b are provided so as to correspond to the circuit boards 303 and 305, respectively.

The width of the guide groove 104 in the Z direction is set to be slightly wider than the width Wb illustrated in FIG. 5A in order to provide allowance. Similarly, the guide grooves 105a and 105b are also configured to provide allowance.

In the Z direction, the width of the protruding section 101 (102) is limited to a predetermined size range. That is, if the width of the protruding section 101 (102) is to be widened to the maximum, the screw hole 107 may not be able to be provided. Therefore, in order to make the width of the heat transfer surface 106 of the tubular housing 100 larger than the width of the protruding section 101 (102) in the Z direction, the width of the guide groove 104 is larger than the width of the protruding section 101 (102). In addition, in order to make full use of the width of the heat transfer surface 106, as illustrated in FIG. 5A, the region of the front or rear end portion of the metal plate 301 is designed to be a region having a width Wa, and the central portion other than the end portion is designed to be a region having a width Wb that is wider than the width Wa. As a result, the area of the metal plate 301 facing the heat transfer surface 106 can be increased, and the heat dissipation effect by the housing surface can be further improved.

(Length of Protruding Section)

As illustrated in FIGS. 4A and 4B, the length of the protruding section 101 protruding from the left joint surface 110a in the X direction is larger than the length of the protruding section 102 protruding from the right joint surface 110b. Here, in FIGS. 4A and 4B, the curved portion 520 is provided in the front part of the tubular housing 100, and the flat surface 510 is provided at the rear part. Correspondingly, as illustrated in FIG. 6A, curved portions are provided at the four corners of the lid section 201 arranged at the front part. In addition, as illustrated in FIG. 6B, flat surfaces are provided at the four corners of the lid section 202 arranged at the rear part. That is, the area of the front of the lid section 201 (area in the YZ direction) is larger than the area of the front of the lid section 202 (area in the YZ direction). That is, the lid section 201 has a larger surface area than the surface area of the lid section 202. Thus, the lid section 201 has a higher function of dissipating heat from the heat generating body (signal processing unit) 302. Accordingly, the protruding length of the protruding section 101 is made larger than the protruding length of the protruding section 102 to improve the heat transfer characteristics. As a result, the heat dissipation characteristics of the housing 1000 are improved.

(Manufacturing Method of Groove Region and Guide Groove)

As illustrated in FIG. 2, a plurality of grooves constituting the groove region 500 is provided so as to extend in the long axis direction (X direction) of the tubular housing 100. In a case where the tubular housing 100 is manufactured by extrusion molding, if a mold having a groove region is used, there is a benefit that a plurality of grooves extending in the long axis direction can be easily formed in the tubular housing 100.

In addition, as illustrated in FIG. 3, the guide grooves 104, 105a, and 105b are also provided so as to extend in the long axis direction (X direction) of the tubular housing 100. As described above, in the case where the groove region 500 provided on the outer surface of the tubular housing 100 is manufactured by extrusion molding, the groove region 500 and the guide grooves 104, 105a, 105b can be formed in the same process.

Figure 9:
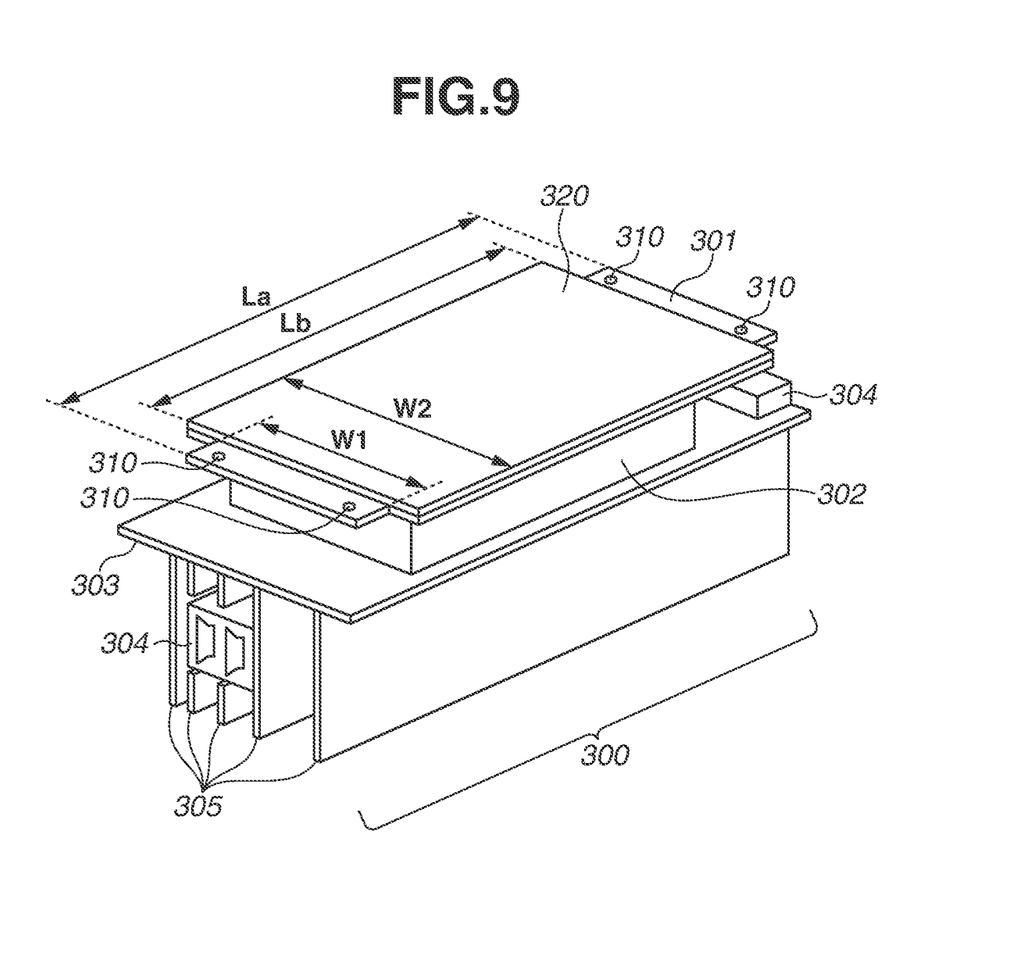
FIG. 9 is a perspective view of the unit to be stored in the housing.

FIG. 9 is a perspective view of a unit 300 according to a second exemplary embodiment. The difference from the first exemplary embodiment is that a heat transfer sheet 320 is provided on the metal plate 301.

As illustrated in FIG. 7, it is preferable, from the viewpoint of heat dissipation, that the entire upper surface of the metal plate 301 is brought into contact with the heat transfer surface 106 inside the tubular housing 100 by the fixing section 400. However, the metal plate 301 may bend due to the weight of the heat generating body 302 or the metal plate 301 or the manufacturing deviation. It is also assumed that the bending of the metal plate 301 causes poor contact between the metal plate 301 and the upper surface of the tubular housing 100, resulting in insufficient heat conduction. Therefore, in the present exemplary embodiment, a decrease in heat dissipation is suppressed by providing the heat transfer sheet 320 between the metal plate 301 and the upper surface of the tubular housing 100.

The heat transfer sheet 320 may be an elastic body having high thermal conductivity and excellent heat transfer characteristics in the thickness direction (Y direction) and being easily deformable in the thickness direction. For example, it is selected from a silicone sheet, an elastomer sheet containing acrylic, and a sheet in which graphite is arranged in the vertical direction, depending on the application and required characteristics. Since the heat transfer sheet 320 can be deformed in the thickness direction, the heat transfer sheet 320 can fill the gap between the upper surface of the metal plate 301 and the heat transfer surface 106 inside the tubular housing 100 to transfer heat to the tubular housing 100 side by bringing the metal plate 301 and the tubular housing 100 close to be fixed.

Figure 10A:
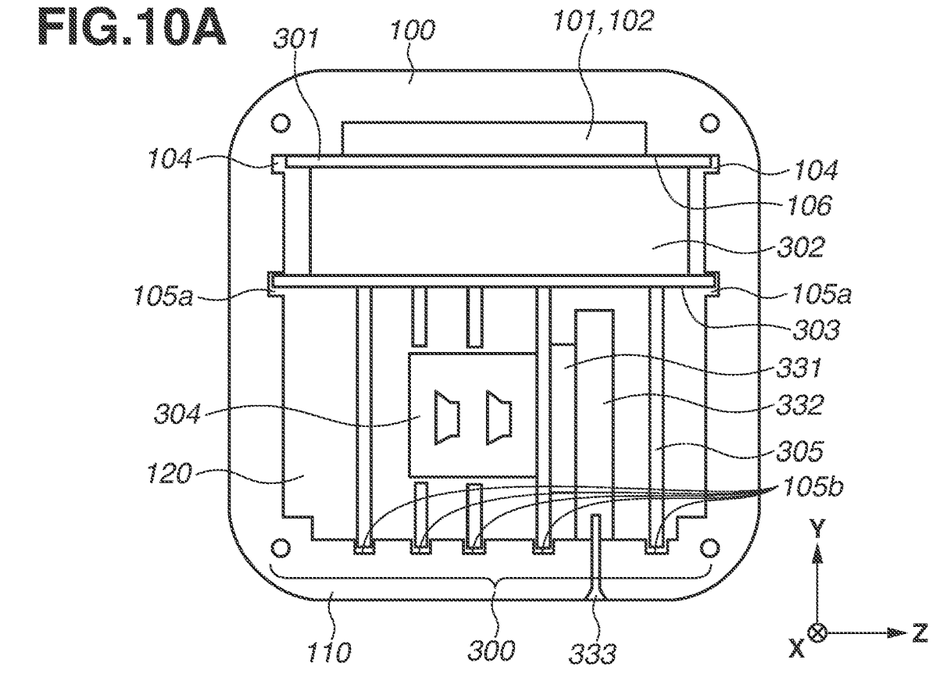
FIGS. 10A and 10B are front views of the housing including the unit.
Figure 10B:
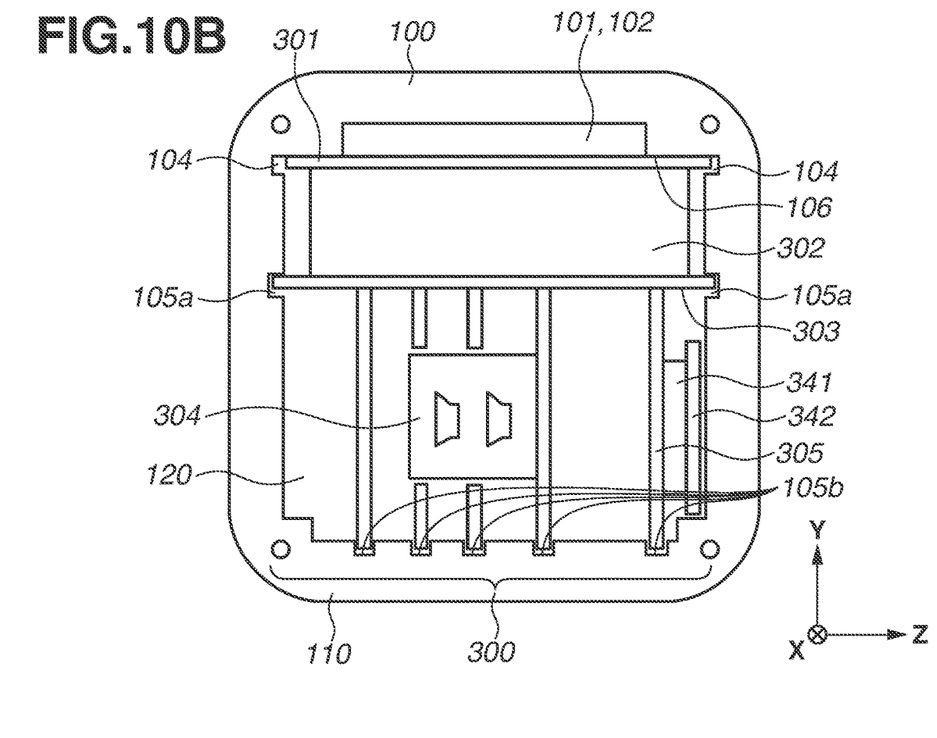

FIGS. 10A and 10B are views illustrating the arrangement position of a heat generating body according to a third exemplary embodiment in a case where there is a heat generating body other than the heat generating body 302 described in the above exemplary embodiment.

FIG. 10A is a view illustrating a form in which a heat generating body 331 is arranged between a plurality of circuit boards 305 at a position where the heat generating body 331 does not contact the bottom surface of the tubular housing 100. In this case, since the heat generating body 302 is located above the heat generating body 331, the heat dissipation effect by the upper surface of the tubular housing 100 cannot be fully utilized. In addition, since the heat generating body 331 is sandwiched between the circuit boards 305 on the right and left sides, the heat dissipation effect by the side wall of the tubular housing 100 also cannot be utilized. Therefore, in the present exemplary embodiment, the heat dissipation effect by the bottom surface of the tubular housing 100 is utilized. Specifically, a heat radiation member 332 is brought into contact with the heat generating body 331, and the heat radiation member 332 and the bottom surface of the tubular housing 100 are fixed by using a screw 333. As a result, the heat from the heat generating body 331 can be conducted to the bottom surface of the tubular housing 100. In doing so, it is more desirable that the heat generating body 331 and the heat radiation member 332 are thermally connected via the abovementioned heat transfer sheet or the like. Furthermore, a heat transfer sheet may be provided between the heat radiation member 332 and the bottom surface of the tubular housing 100 to dissipate heat through the bottom surface of the tubular housing 100.

The heat radiation member 332 is, for example, a metal member, and is selected from aluminum, iron, copper, and alloys of these. In addition, the heat radiation member 332 is not limited to the metal member, and may be a resin material containing a heat conductive filler made of an inorganic powder of ceramics, a metal powder such as aluminum and copper, or the like. In addition, the screw 333 is not necessarily essential. That is, in order to allow heat conduction between the heat radiation member 332 and the bottom surface of the tubular housing 100, a fixing section that fixes the heat radiation member 332 and the tubular housing 100 so as to be in contact with each other may be provided. For example, the fixing section may be an adhesive that bonds the heat radiation member 332 and the bottom surface of the tubular housing 100. As the adhesive, it is preferable to use a material having high thermal conductivity and a thin film thickness.

FIG. 10B is a view illustrating a form in which a heat generating body 341 is arranged between the circuit board 305 and the side surface of the tubular housing 100. In a case where a heat radiation member 342 is not provided, the area of the main surface of the heat generating body 341 (the area in the XY plane) is small, and the distance between the heat generating body 341 and the side surface of the tubular housing 100 is large. In such a case, the heat dissipation effect using the side surface of the tubular housing 100 cannot be expected so much. However, if a member thermally connected to the heat generating body 341 is fixed to the inner side surface of the tubular housing 100, a large strain may be generated in the unit 300, which is not desired. On the other hand, as illustrated in FIG. 10B, if the heat radiation member 342 having a main surface with an area larger than the area of the main surface of the heat generating body 341 is provided between the heat generating body 341 and the side surface of the tubular housing 100, the heat dissipation effect using the side surface of the tubular housing 100 can be expected. In addition, in FIG. 10B, the main surface of the heat radiation member 342 and the side surface of the tubular housing 100 face each other, but are not in contact with each other. In this way, even when the main surface of the heat radiation member 342 and the side surface of the tubular housing 100 are not in contact with each other, heat can be dissipated from the heat generating body 341 via air. In addition, if the main surface of the heat radiation member 342 is configured to be in contact with the side surface of the tubular housing 100, the heat from the heat generating body 341 can be released to the outside with higher efficiency.

In the above description, the configuration in which the heat radiation member 342 and the side surface of the tubular housing 100 are not in contact with each other has been described. However, the present exemplary embodiment is not limited to this configuration, and may be configured in such a manner that the heat radiation member 342 and a part of the tubular housing 100, or the heat radiation member 342 and a region of half or more of the tubular housing 100 are in contact with each other.

A fourth exemplary embodiment describes the members related to the joining between the lid section 201 and the tubular housing 100 described in the above exemplary embodiment.

Figure 11A:
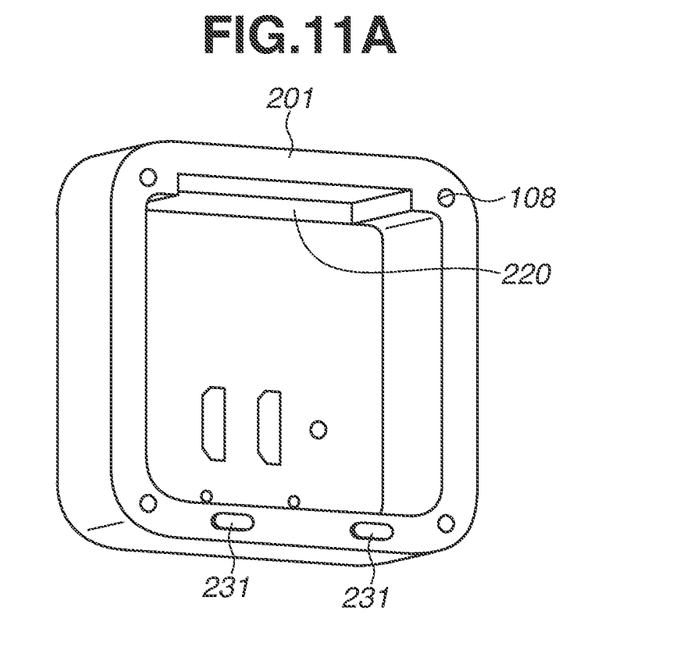
FIGS. 11A and 11B are a perspective view of the front lid and a perspective view of a part of the housing corresponding to the front lid.

FIG. 11A is a view illustrating the configuration of the lid section 201, and protrusions 231 are provided on the joint surface of the bottom portion of the lid section 201. On the other hand, FIG. 11B is a view illustrating the configuration of the tubular housing 100, and recesses 232 are provided on the joint surface of the bottom portion of the tubular housing 100.

Figure 11B:
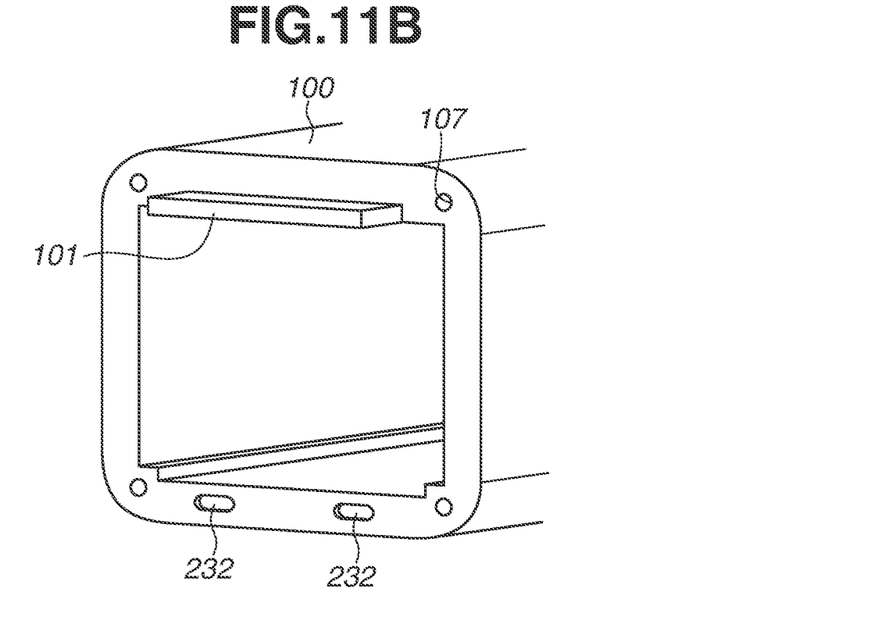

Here, in FIGS. 11A and 11B, the protrusions 231 and the recesses 232 are made of aluminum that has not been anodized. On the other hand, members different from the protrusions 231 and the recesses 232, specifically, the exterior surface and the interior surface of the lid section 201, and the surface other than the protrusions 231 in the joint surface with the tubular housing 100 is made of aluminum that has been anodized. Similarly, the exterior and interior surfaces of the tubular housing 100 and the surfaces other than the recesses 232 in the joint surface with the lid section 201 are made of aluminum that has been anodized. By performing aluminum anodization treatment, an oxide film is formed on the surface of aluminum. Since the wear resistance and corrosion resistance are improved by the aluminum anodization treatment, it is preferable to perform the aluminum anodization treatment on the exterior and interior. On the other hand, there is also a disadvantage that the thermal conductivity is reduced to approximately ⅓ if the aluminum anodization treatment is performed.

When heat is conducted with the use of each surface (the upper surface, both side surfaces, and bottom surface) of the tubular housing 100, it is preferable that the housing of the lid section 201 combined with the tubular housing 100 is also used to diffuse heat to the outside. Therefore, in the present exemplary embodiment, the lid section 201 is also efficiently used as a heat path by providing an unanodized protrusion/recess member (fitting member) on the connecting surface between the tubular housing 100 and the lid section 201. In addition, the tubular housing 100 and the lid sections 201 and 202 can be securely connected electrically, and thus the effect of improving noise characteristics can also be obtained.

In the above, a protrusion is provided on the joint surface of the lid section 201 and a recess is provided on the joint surface of the tubular housing 100. However, the recess may be provided on the joint surface of the lid section 201 and the protrusion may be provided on the joint surface of the tubular housing 100. In addition, an unanodized protrusion/recess member (fitting member) may be provided not only on the lid section 201 but also on the joint surface of the lid section 202 and the joint surface of the tubular housing 100 in contact with the lid section 202. Furthermore, an unanodized protrusion/recess member (fitting member) may be provided not only on one side but also on a plurality of sides or all four sides of the tubular housing 100. In addition, by inserting a metal foil or the like between the protrusion and recess, it is possible to absorb errors in processing dimensions and ensure contact.

Other Embodiments

In the above exemplary embodiments, the heat generating body is a signal processing unit that processes the signal of the image data from the imaging apparatus, but the heat generating body is not limited to this.

In addition, the present disclosure is not limited to the above embodiments, and various modifications can be made. An example in which a part of the configuration of any of the exemplary embodiments is added to another exemplary embodiment and an example in which a part of the configuration of any of the exemplary embodiments is replaced with a part of the configuration of another exemplary embodiment are also embodiments of the present disclosure.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-008770, filed Jan. 22, 2020, which is hereby incorporated by reference herein in its entirety.

What is claimed is:

1. A housing comprising:
 a tubular housing having a long axis in a first direction; and
 a first lid section configured to be fitted to one end portion of the tubular housing,
 wherein the tubular housing includes a first protruding section protruding toward the first lid section from a joint surface in contact with the first lid section,
 wherein, in a second direction orthogonal to the first direction, a heat conductive member configured to conduct heat from a heat generating body disposed inside the tubular housing includes a first region having a first width and a second region having a second width larger than the first width, and
 wherein the heat conductive member and the tubular housing are fixed together by fixing the first region and the first protruding section to each other.

2. The housing according to claim 1, the housing further comprising a fixing section,
 wherein the first protruding section includes a first opening portion,
 wherein the heat conductive member includes a second opening portion, and
 wherein the fixing section is configured to fix the heat conductive member and the tubular housing together via the first opening portion and the second opening portion.

3. The housing according to claim 1, further comprising a second lid section configured to be fitted to another end portion of the tubular housing,
 wherein the tubular housing includes a second protruding section protruding toward the second lid section from a joint surface in contact with the second lid section, and
 wherein the second protruding section has a configuration allowing the heat conductive member and the tubular housing to be fixed together.

4. The housing according to claim 3, further comprising a fixing section,
 wherein the second protruding section includes a third opening portion,
 wherein the heat conductive member includes a fourth opening portion, and
 wherein the fixing section is configured to fix the heat conductive member and the tubular housing together via the third opening portion and the fourth opening portion.

5. The housing according to claim 1,
 wherein the first lid section includes a recessed portion, and the recessed portion and the first protruding section are fitted to each other, and
 wherein the first protruding section is not exposed to an outside of the housing.

6. The housing according to claim 1,
 wherein the tubular housing includes a groove region having a plurality of grooves extending in the first direction, and
 wherein the groove region is formed on at least one of a plurality of surfaces of the tubular housing.

7. The housing according to claim 6,
 wherein the tubular housing includes a guide groove extending in the first direction in an inside of the tubular housing, and
 wherein the groove region of the tubular housing and the guide groove are formed by extrusion molding.

8. The housing according to claim 1,
 wherein the tubular housing includes a guide groove extending in the first direction in an inside of the tubular housing, and
 wherein the second region of the heat conductive member is provided in the guide groove.

9. The housing according to claim 1, wherein the second region of the heat conductive member is provided to cover an outer extension of a main surface of the heat generating body in a plan view.

10. The housing according to claim 1,
 wherein a connector, through which an image data signal output from an imaging apparatus provided outside the housing is input, is provided in the tubular housing, and
 wherein the heat generating body is a signal processing unit configured to process the image data signal input through the connector.

11. The housing according to claim 1, wherein the tubular housing is formed of metal.

12. The housing according to claim 1, wherein the heat conductive member is a metal plate.

13. The housing according to claim 1,
 wherein the tubular housing includes a first side surface, a second side surface, an upper surface, and a bottom surface, and
 wherein the housing has a flat surface at a first corner section formed by the first side surface and the upper surface.

14. The housing according to claim 13, wherein the housing has a first curved portion at the first corner section.

15. The housing according to claim 1,
 wherein the tubular housing has a first joint surface in contact with the first lid section,
 wherein the first lid section has a second joint surface in contact with the tubular housing,
 wherein a fitting member configured to fix the tubular housing and the first lid section together is provided on the first joint surface and the second joint surface, and
 wherein the fitting member is formed of unanodized aluminum.

16. The housing according to claim 15, wherein an exterior of the tubular housing and an exterior of the first lid section are each formed of anodized aluminum.

17. The housing according to claim 1, wherein a heat transfer sheet is disposed between the heat conductive member and the tubular housing.

18. A housing comprising:
 a tubular housing;
 a first lid section configured to be fitted to one end portion of the tubular housing, and a second lid section configured to be fitted to another end portion of the tubular housing, wherein the tubular housing includes a first protruding section protruding toward the first lid section from a joint surface in contact with the first lid section and a second protruding section protruding toward the second lid section from a joint surface in contact with the second lid section, wherein the first protruding section has a configuration allowing the tubular housing and a heat conductive member, configured to conduct heat from a heat generating body disposed inside the tubular housing, to be fixed together, and wherein the second protruding section has a configuration allowing the heat conductive member and the tubular housing to be fixed together.

19. The housing according to claim 18, further comprising a fixing section, wherein the second protruding section includes a third opening portion, wherein the heat conductive member includes a fourth opening portion, and wherein the fixing section is configured to fix the heat conductive member and the tubular housing together via the third opening portion and the fourth opening portion.

* * * * *